US008925251B1

(12) United States Patent
Rust

(10) Patent No.: US 8,925,251 B1
(45) Date of Patent: Jan. 6, 2015

(54) CONSTANT FORCE SPRING PERIMETER SEAL FOR AN ELECTROMAGNETIC SHIELDED DOOR

(71) Applicant: Stephen Vincent Rust, Pompton Lakes, NJ (US)

(72) Inventor: Stephen Vincent Rust, Pompton Lakes, NJ (US)

( * ) Notice: Subject to any disclaimer, the term of this patent is extended or adjusted under 35 U.S.C. 154(b) by 0 days.

(21) Appl. No.: 14/102,219

(22) Filed: Dec. 10, 2013

(51) Int. Cl.
*H05K 9/00* (2006.01)
*E06B 7/18* (2006.01)
*E06B 5/10* (2006.01)

(52) U.S. Cl.
CPC .... *E06B 7/18* (2013.01); *E06B 5/10* (2013.01)
USPC ............................ 49/483.1; 49/401; 49/495.1

(58) Field of Classification Search
USPC .................. 49/400, 401, 475.1, 480.1, 483.1, 49/495.1, 498.1
See application file for complete search history.

(56) References Cited

U.S. PATENT DOCUMENTS

| | | | | |
|---|---|---|---|---|
| 1,666,328 | A * | 4/1928 | Dennis | 49/496.1 |
| 1,701,969 | A * | 2/1929 | Brazell | 49/441 |
| 3,055,969 | A * | 9/1962 | Schaller, Jr. | 174/369 |
| 3,277,230 | A * | 10/1966 | Stickney et al. | 174/354 |
| 3,296,356 | A * | 1/1967 | McAdams | 174/367 |
| 3,304,360 | A * | 2/1967 | Hadley et al. | 174/367 |
| 3,437,735 | A * | 4/1969 | Schaller, Jr. | 174/367 |
| 3,504,095 | A * | 3/1970 | Roberson et al. | 174/355 |
| 3,589,070 | A * | 6/1971 | Hansen | 49/483.1 |
| 4,069,618 | A * | 1/1978 | Geiss | 49/483.1 |
| 4,626,615 | A * | 12/1986 | Van Dyk, Jr. | 174/369 |
| 4,677,251 | A * | 6/1987 | Merewether | 174/368 |
| 4,720,936 | A * | 1/1988 | Ellingson | 49/480.1 |
| 4,724,635 | A * | 2/1988 | Side et al. | 49/483.1 |
| 4,760,214 | A * | 7/1988 | Bienia et al. | 174/368 |
| 4,786,758 | A * | 11/1988 | Zielinski | 174/369 |
| 4,817,337 | A * | 4/1989 | Lahita | 49/483.1 |
| 4,910,920 | A * | 3/1990 | Nichols | 49/484.1 |
| 4,929,802 | A * | 5/1990 | Schaepers et al. | 174/368 |
| 5,029,254 | A * | 7/1991 | Stickney | 174/354 |
| 5,223,670 | A * | 6/1993 | Hogan et al. | 174/368 |
| 5,250,751 | A * | 10/1993 | Yamaguchi | 174/354 |
| 5,599,027 | A * | 2/1997 | Balsells | 277/642 |
| 5,952,608 | A * | 9/1999 | Kim | 174/354 |
| 6,137,052 | A * | 10/2000 | Kurrer et al. | 174/351 |
| 6,294,729 | B1 * | 9/2001 | Kaplo | 174/371 |
| 6,323,419 | B1 * | 11/2001 | Toy | 174/390 |
| 6,483,023 | B1 * | 11/2002 | Jacques | 174/358 |
| 6,534,706 | B1 * | 3/2003 | Rapp et al. | 174/354 |
| 6,555,744 | B1 * | 4/2003 | Wang | 174/384 |
| 6,639,145 | B1 * | 10/2003 | Nurmi | 174/387 |
| 6,914,184 | B1 * | 7/2005 | Lahita | 174/374 |
| 6,992,246 | B2 * | 1/2006 | Christou | 174/374 |
| 7,491,898 | B2 * | 2/2009 | Villanella | 174/368 |

(Continued)

*Primary Examiner* — Katherine Mitchell
*Assistant Examiner* — Justin Rephann

(57) ABSTRACT

An electromagnetic shielded door with constant force spring perimeter seal may include a door panel and door jamb. The door panel may include a sealing member around a perimeter of an inside face of the door panel. In certain embodiments, the sealing member may have a raised sealing surface. The door jamb may have at least one spring containment member along an inside perimeter facing the door panel. A spring mechanism may attach to the at least one spring containment member. The spring mechanism may include a plurality of continuous force flat torsion roller springs attached to at least one spring containment member which may be part of a channel. The raised sealing surface may engage with the plurality of continuous force flat torsion roller springs on the at least one spring containment member of the channel.

9 Claims, 6 Drawing Sheets

(56) References Cited

U.S. PATENT DOCUMENTS

| | | | | |
|---|---|---|---|---|
| 7,870,701 | B2 * | 1/2011 | Tammaro et al. | 52/656.4 |
| 8,043,098 | B2 * | 10/2011 | Huang | 439/95 |
| 8,522,484 | B2 * | 9/2013 | Gaviglia | 49/483.1 |
| 8,677,688 | B2 * | 3/2014 | Skibinski et al. | 49/125 |
| 2002/0179314 | A1 * | 12/2002 | Grave et al. | 174/35 GC |
| 2003/0051891 | A1 * | 3/2003 | Rapp et al. | 174/35 GC |
| 2004/0006921 | A1 * | 1/2004 | Miller | 49/498.1 |
| 2006/0005472 | A1 * | 1/2006 | Miller | 49/498.1 |

* cited by examiner

CONSTANT FORCE SPRING PERIMETER SEAL FOR AN ELECTROMAGNETIC SHIELDED DOOR

BACKGROUND OF THE INVENTION

The present invention relates to perimeter seals for electromagnetic shielded doors and, more particularly, to a constant force spring perimeter seal for an electromagnetic shielded door.

Existing radio frequency (RF) shielded doors utilize a mechanical contact mechanism that is prone to wear, requires excessive maintenance, and requires a large amount of force to engage and disengage. Existing RF door seal mechanisms rely on a scraping action of a knife edge between two rows of compression spring.

Currently, RF door seal mechanisms encounter a large amount of mechanical resistance to opening and closing the door. As a result, large mechanical handles, levers, cam mechanisms, and elaborate latching schemes are required to overcome this force. In addition, if no externally powered mechanism is present to aid in the opening of the door, the opening of the door relies entirely on the strength of an individual to overcome the compressive force between the spring fingers and the knife edge. There have also been reports of injuries sustained to the wrist, shoulder, and back of operators using this style door. The latching mechanism is also prone to failure which poses a possible safety concern of locking people inside of an RF shielded room.

As can be seen, there is a need for a constant force spring perimeter seal for an electromagnetic shielded door that may include a rolling spring mechanism that may allow the door to open and close easily and smoothly while still achieving the metal to metal seal required for proper RF shielding and may transmit a repulsive force that aids in the opening of the door.

SUMMARY OF THE INVENTION

In one aspect of the present invention, an electromagnetic shielded door with constant force spring perimeter seal comprises: a door panel, wherein the door panel comprises a sealing surface; and a door jamb having a spring containment member along an inside perimeter facing the door panel, wherein a spring mechanism attaches to the spring containment member.

In another aspect of the present invention, an electromagnetic shielded door with constant force spring perimeter seal comprises: a door panel, wherein the door panel comprises a sealing member having a raised sealing surface around a perimeter of an inside face of the door panel; and a door jamb having at least one spring containment member along a channel along an inside perimeter facing the raised sealing surface of the door panel, wherein a spring mechanism attaches to the channel.

These and other features, aspects and advantages of the present invention will become better understood with reference to the following drawings, description and claims.

DETAILED DESCRIPTION OF THE INVENTION

Figure 1:
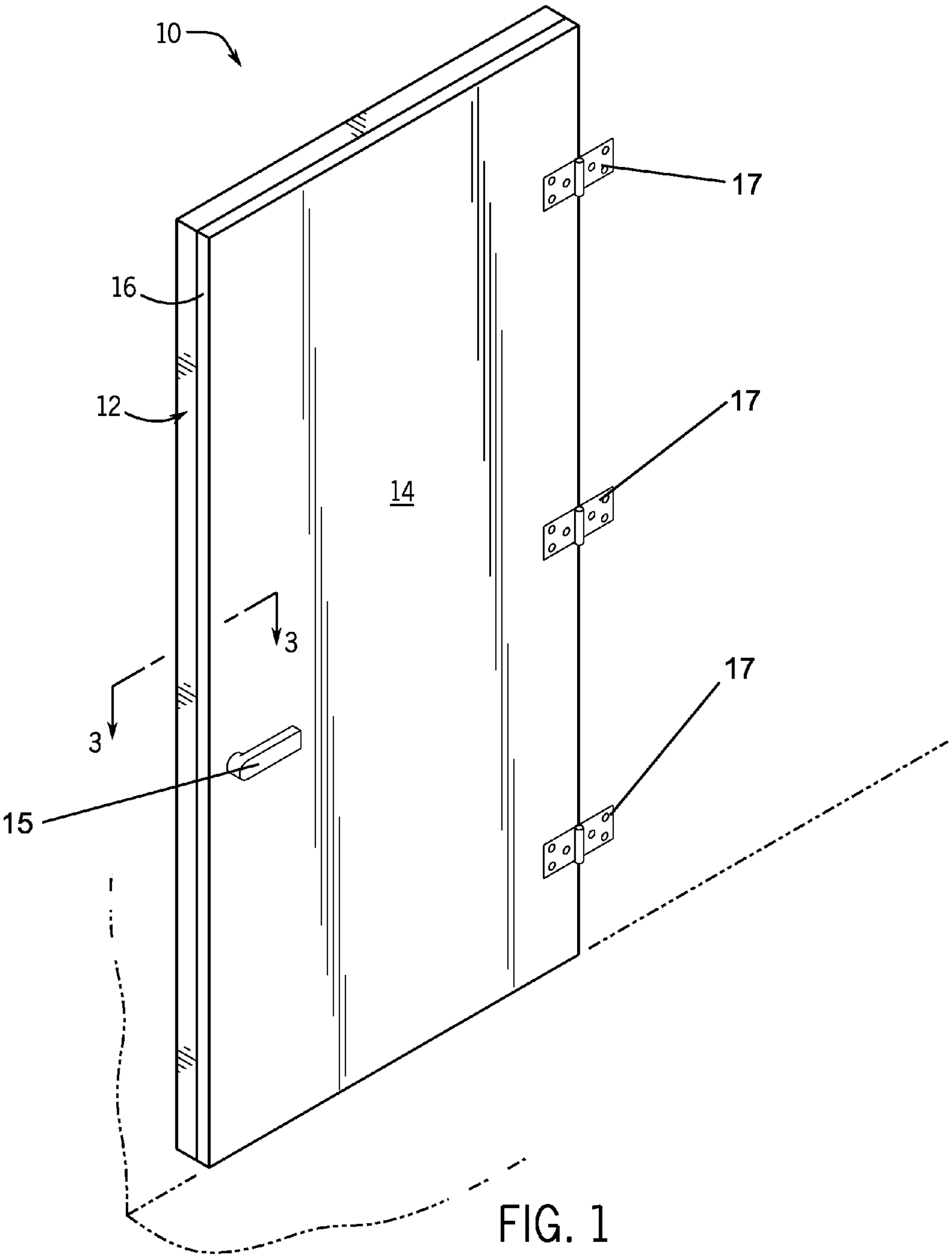
FIG. 1 is a perspective view of an exemplary embodiment of the present invention in a closed position.
Figure 2:
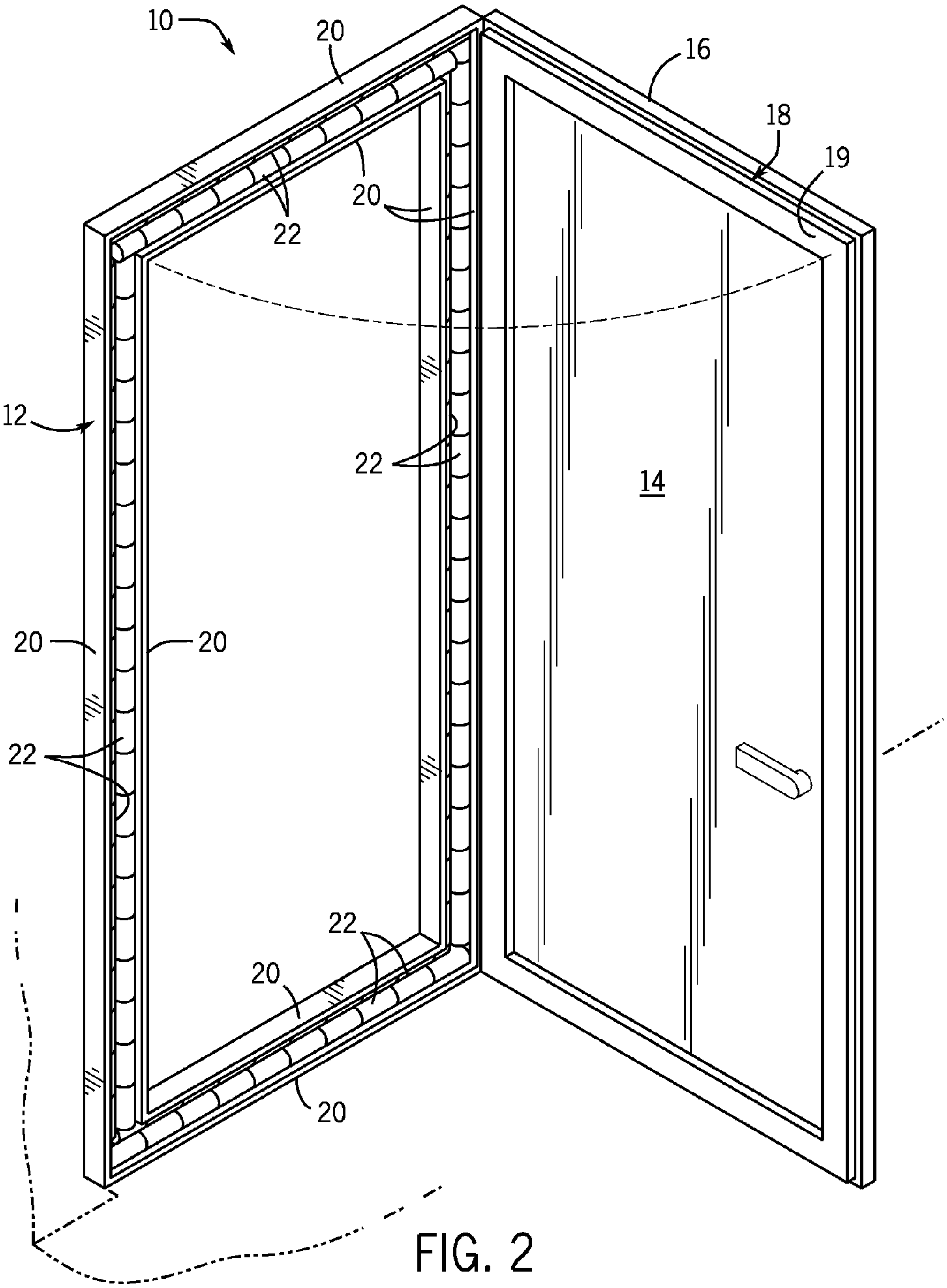
FIG. 2 is a perspective view of an exemplary embodiment of the present invention in an open position.
Figure 3:
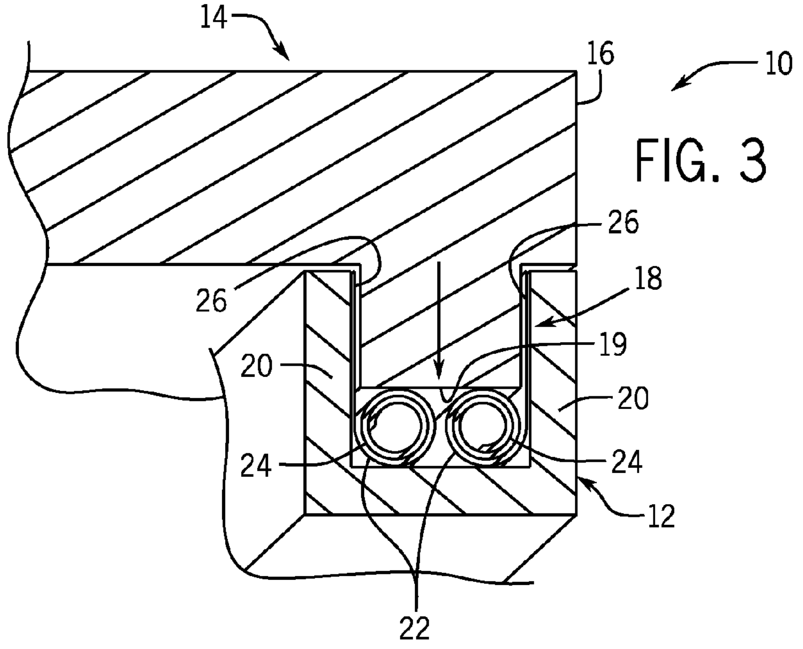
FIG. 3 is a cross-sectional perspective view of an exemplary embodiment of the present invention taken on line 3-3 of FIG. 1.
Figure 4:
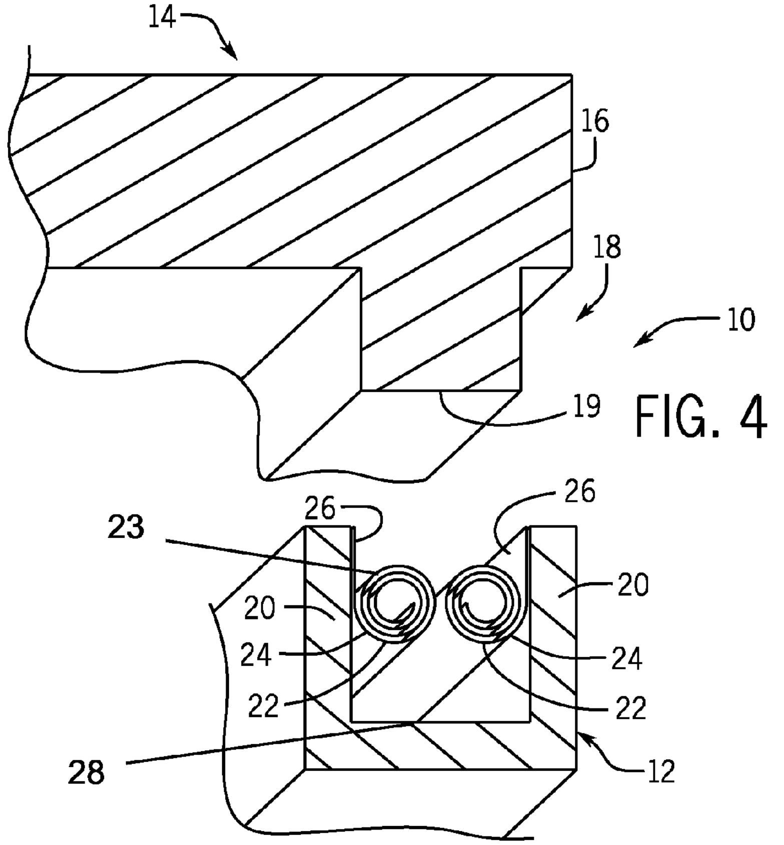
FIG. 4 is a cross-sectional partially exploded perspective view of an exemplary embodiment of the present invention.

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Broadly, an embodiment of the present invention provides an electromagnetic shielded door with constant force spring perimeter seal may include a door panel and door jamb. The door panel may include a sealing member around a perimeter of an inside face of the door panel. In certain embodiments, the sealing member may have a raised sealing surface. The door jamb may have at least one spring containment member along an inside perimeter facing the door panel. A spring mechanism may attach to the at least one spring containment member. The spring mechanism may include a plurality of continuous force flat torsion roller springs attached to at least one spring containment member which may be part of a channel. The raised sealing surface may engage with the plurality of continuous force flat torsion roller springs on the at least one spring containment member of the channel.

As is illustrated in FIGS. 1 through 10, the present invention 10 may include a door panel 14. The door panel 14 may have a flange 16. In certain embodiments, the door panel 14 may include a sealing surface 86. In certain embodiments, the door panel 14 may include a sealing member 18 having a raised sealing surface 19. A door jamb 12 may have at least one spring containment member 20 along the inside perimeter facing the door panel 14. The door jamb 12 may include a channel 28 along an inside perimeter facing the door panel 14. In certain embodiments, the channel 28 along the inside perimeter may face the raised sealing surface 19. Within and attached to the channel 28 may be a spring mechanism 22. In certain embodiments, the spring mechanism 22 may include a plurality of continuous force flat torsion roller springs 23 attached to at least one inner side of the channel 28. In certain embodiments, the raised sealing surface 19 may engage with the continuous force flat torsion roller springs 23 on the inside of the channel 28. In other embodiments, the sealing surface 86 of the door panel 14 may engage with the continuous force flat torsion roller springs 23. The continuous force flat torsion roller springs 23 may have legs 26 that may be attached to at least one spring containment member 20 of the channel 28. The coils 24 of the continuous force flat torsion roller springs 23 may be wound and unwound based on the pressure applied from the door panel 14 in certain embodiments, and from the raised sealing surface 19 in other embodiments.

In certain embodiments, the door panel 14 may include a plurality of hinges 17 along a first side. At least one handle along one of the inside face and an outside face of the door may be attached to the door panel 14.

A method of making the present invention may include the following. An electrically conductive door constructed with a material such as metal or the like may be fabricated such that there may be a raised metal surface around the perimeter of the inside face of the door. Hinges such as heavy duty hinges or the like and the latch mechanism may be added. Where the latch mechanism penetrates the door to join the inner and outer latch handles, an appropriate Radio Frequency gasket may be used. This can be comprised of metal washers, bronze wool, electrically conductive elastomers, electrically conductive foams, or the like. The door jamb 12 may also be fabricated from an electrically conductive material such as metal and the like. The door jamb 12 may have a channel 28 along the inside perimeter which may face the raised surface of the door. On at least one spring containment member 20 of the channel 28, a plurality of continuous force torsion flat roller springs 23 may be attached. These may be attached via riveting, soldering, brazing, welding, by the use of an integral clip formed at the fixed end of the spring or the like. The door panel 14 and door jamb 12 may be assembled in a fashion where the raised surface may engage with the continuous force torsion flat roller springs 23 on the inside of the channel 28. The door panel 14/door jamb 12 assembly may be installed into a new or existing RF shielded enclosure such that the perimeter of the assembly may be electrically connected to the metal walls of the shielded enclosure.

A method of using the present invention may include the following. The door may be used to shield an environment from multiple sources and types of electromagnetic energy. The frequency range and level of shielding may depend upon the door material and thickness, the door jamb 12 material, the spring material, the design of the metal surface that engages with the springs and the like. In certain embodiments, the door may be fabricated from layers of different materials to enhance the frequency and level of electromagnetic shielding. The present invention may be used in areas such as ElectroMagnetic Compatibility (EMC) chambers, RF shielded rooms, table top RF enclosures, RF shielded access panels, MRI suits, X-ray rooms, laboratories with sensitive electronic equipment, neurological examination rooms and the like.

The constant force spring perimeter seal for electromagnetic shielded door may also provide a level of acoustic shielding depending upon the materials and thicknesses used in the particular application. The spring mechanism 22 may allow the door to open and close easily and smoothly while still achieving the surface to surface seal required for proper RF shielding. The spring mechanism 22 may also transmit a repulsive force that may aid in the opening of the door. This repulsive force may eliminate the need for elaborate closing and latching mechanisms currently required. The continuous force flat torsion roller springs 23 may permit a rolling action to create the intimate metal to metal contact required for a proper electromagnetic seal. When an individual closes the door, the sealing surface 86 or the raised sealing surface 19, pushes against the plurality of springs, forcing the springs to uncoil and provide a continuous contact with the sealing surface while in a closed position. When an individual opens the door, the force of the spring rolling back to a coiled position may help in the movement of the door as the spring applies force to the door away from the door jamb 12.

An electrically conductive material door and raised surface such as metal or the like may be used to provide the level and frequency range of the electromagnetic energy shielding that is required. Examples of door surface material may be stainless steel, galvanized steel, copper, bronze, aluminum, Mu Metal, conductive plastic, metal foils, and the like. In most cases, both inner and outer surfaces of the door may be constructed out of an electrically conductive material. The edges of the door may also be constructed of a conductive material to electrically couple the inner and outer faces of the door. Electrically conductive continuous force flat torsion roller springs 23 may be used to provide continuous intimate contact between the door panel 14 and the inside of the door jamb 12. The continuous force flat torsion roller springs 23 may be constructed of an electrically conductive material. Examples include, but are not limited to, phosphor bronze, beryllium copper, stainless steel, high carbon steel, steel alloys, Monel, Inconel, chromium alloys, and the like. This effectively creates a continuous electrically conductive surface when the door may be in the closed position.

Figure 5:
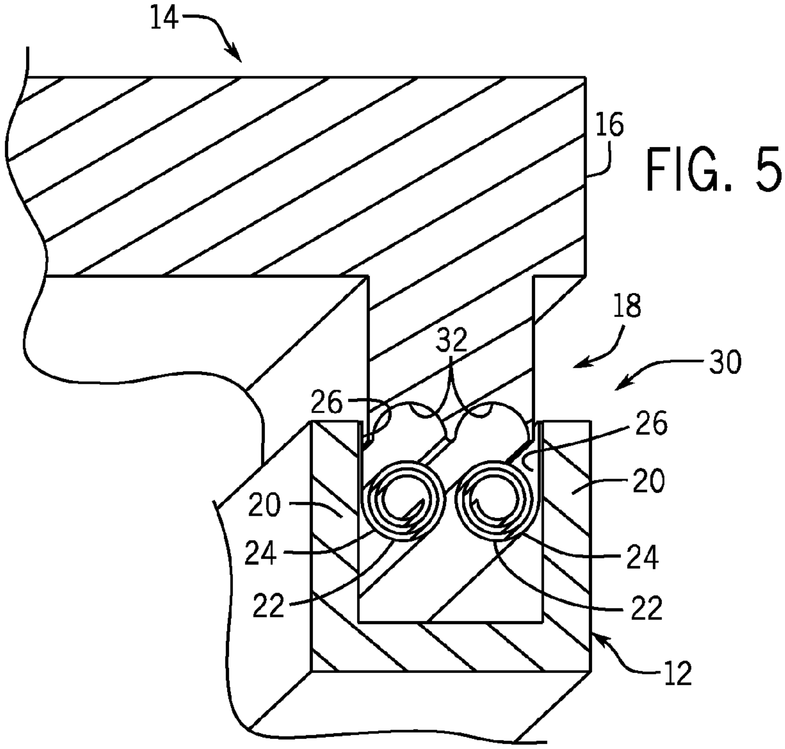
FIG. 5 is a cross-sectional partially exploded perspective view of an alternate embodiment of the present invention.
Figure 6:
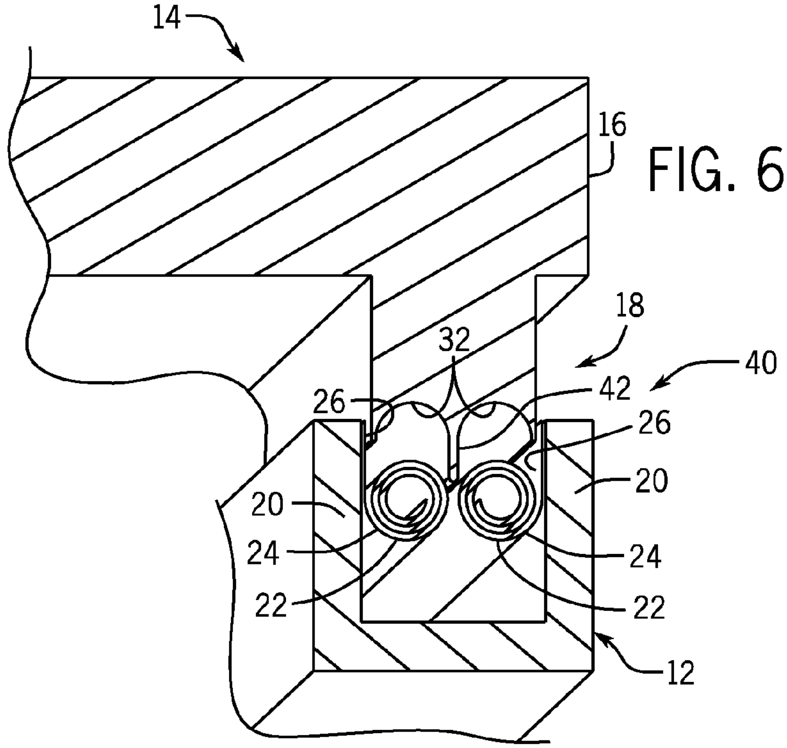
FIG. 6 is a cross-sectional partially exploded perspective view of an alternate embodiment of the present invention.
Figure 7:
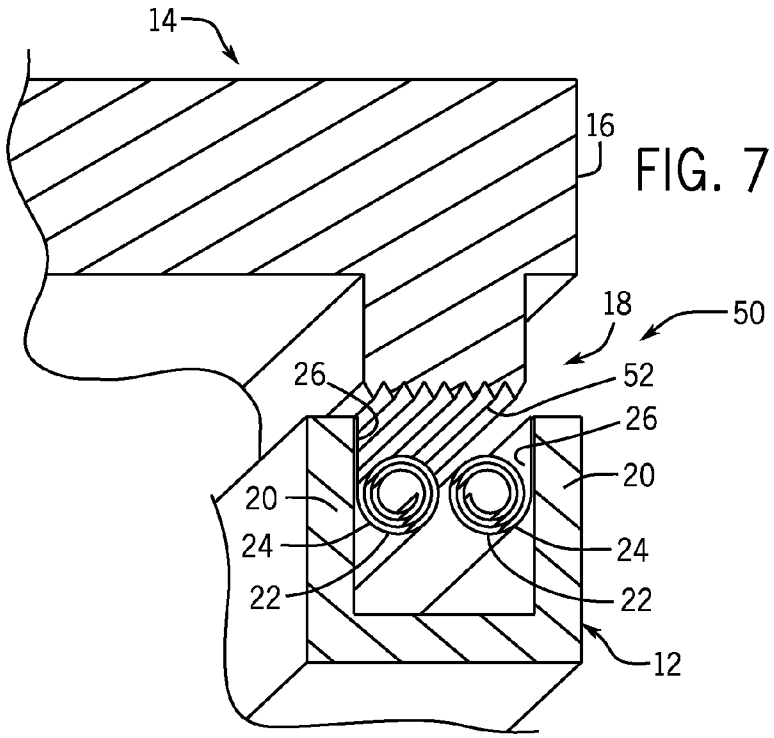
FIG. 7 is a cross-sectional partially exploded perspective view of an alternate embodiment of the present invention.
Figure 8:
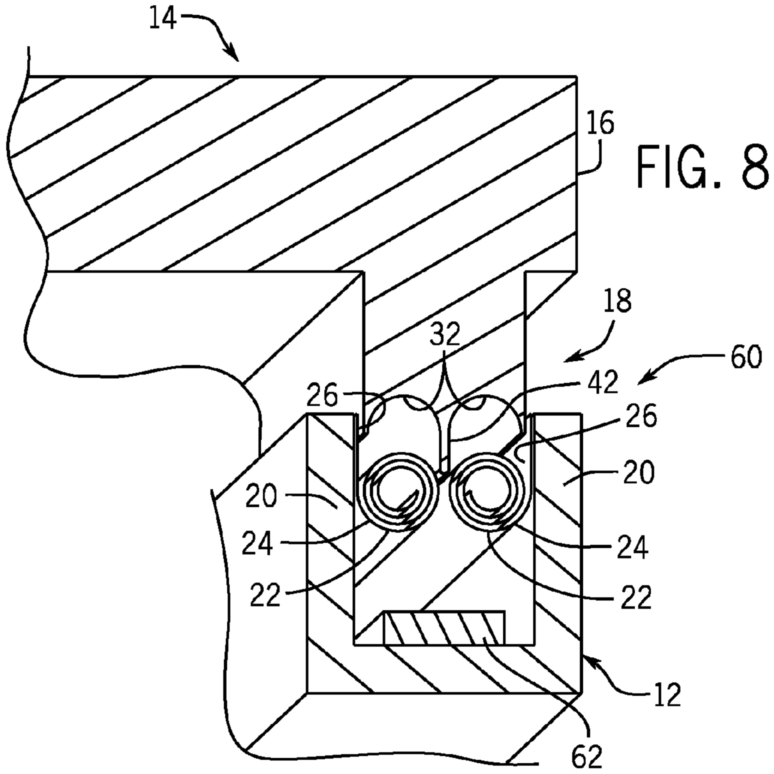
FIG. 8 is a cross-sectional partially exploded perspective view of an alternate embodiment of the present invention.
Figure 9:
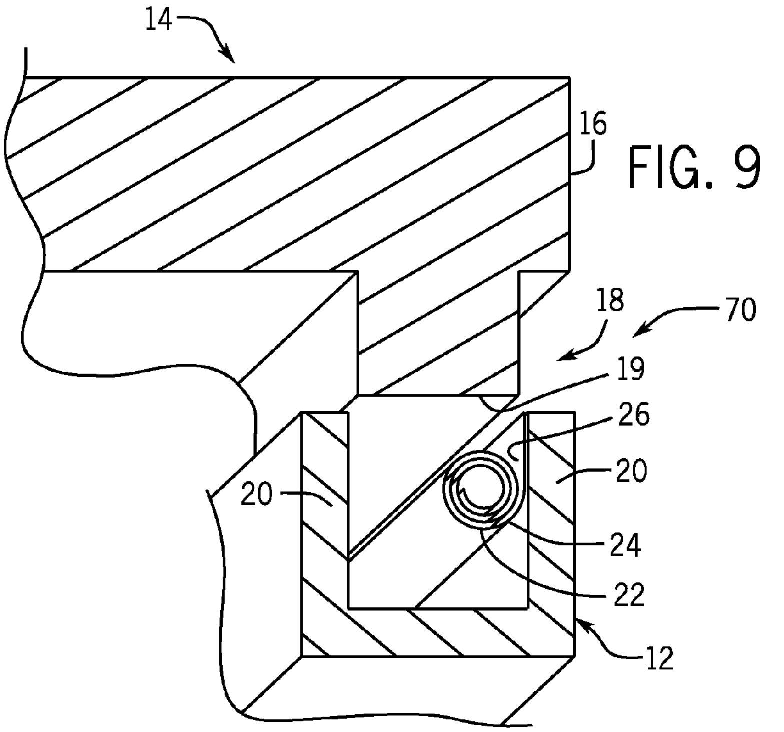
FIG. 9 is a cross-sectional partially exploded perspective view of an alternate embodiment of the present invention.

In certain embodiments, the raised surface may also have a modified design. The raised surface may be flat such as in FIGS. 3 and 4, grooved raised surface 52 such as in FIG. 7 showing an alternate embodiment 50, scalloped raised surface 32 such as in FIG. 5 which shows an alternate embodiment 30, extended raised surfaces 42, such as in FIGS. 6 and 8, which show alternate embodiments 40, 60, a combinations thereof or the like. For example, two curved indents may be added such that the radius of these indents matches the radius of the continuous force flat torsion roller springs 23 such as is shown in FIG. 5. This may increase the surface area in contact between the contact point of the door panel 14 and the rollers. The center section of the block may also be extended such that a thin section travels through the continuous force flat torsion roller springs 23 such as in the alternate embodiment 40. This section may bottom out on the inside metal floor of the pocket or into a compliant electrically conductive material 62 installed therein. In certain embodiments the device may employ only one row of continuous force flat torsion roller springs 23 such as is shown in FIG. 9 in an alternate embodiment 70. The raised surface may engage this row of continuous force flat torsion roller springs 23 in a similar fashion as with two rows of springs. However, the contact surface area may be essentially reduced.

Figure 10:
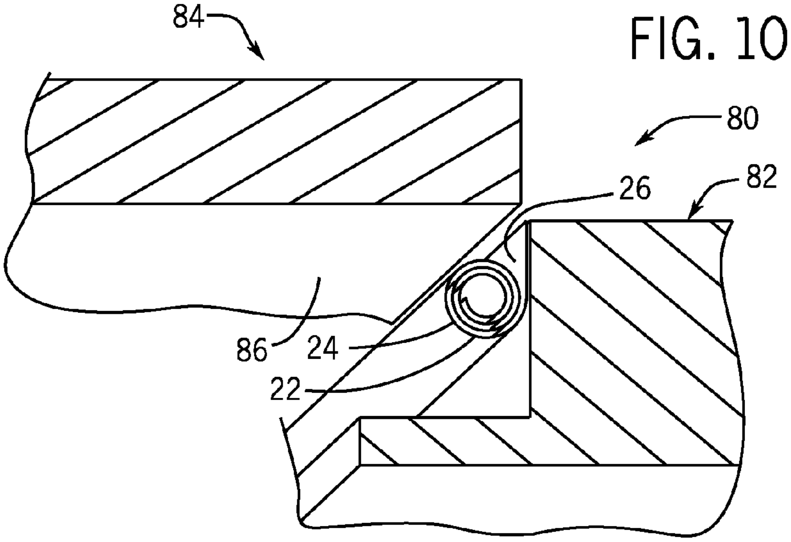
FIG. 10 is a cross-sectional partially exploded perspective view of an alternate embodiment of the present invention.

In certain embodiments, the sealing surface 86 of the door panel 84 may be used in place of the raised surface as is shown in the alternate embodiment 80 in FIG. 10. In this configuration, only one row of exposed continuous force flat torsion roller springs 23 attached to the spring containment member 20 of the door jamb 82 may be used.

It should be understood, of course, that the foregoing relates to exemplary embodiments of the invention and that modifications may be made without departing from the spirit and scope of the invention as set forth in the following claims.

What is claimed is:

1. An electromagnetic shielded door with constant force spring perimeter seal comprising:

a door panel comprising an inner surface, an outer surface, and an outer edge and a sealing surface along the inner surface near the outer edge; and a door jamb having at least one spring containment member along an inside perimeter facing the door panel; and at least one coiled spring mechanism attached within the at least one spring containment member, wherein the at least one coiled spring mechanism comprises an open side facing the door panel, wherein the electromagnetic shielded door comprises an open position and a closed position, wherein the open position comprises the at least one coiled spring mechanism substantially coiled, and the closed position comprises the at least one coiled spring mechanism substantially uncoiled.

2. The electromagnetic shielded door with constant force spring perimeter seal of claim 1, further comprising at least one handle along one of the inside face and an outside face of the door panel.

3. The electromagnetic shielded door seal of claim 1, wherein the sealing surface comprises a raised sealing surface.

4. The electromagnetic shielded door seal of claim 3, wherein the at least one spring containment member forms a channel along the inside perimeter.

5. The electromagnetic shielded door with constant force spring perimeter seal of claim 4, wherein the raised sealing surface engages with the at least one coiled spring mechanism on the at least one spring containment member within the channel.

6. The electromagnetic shielded door with constant force spring perimeter seal of claim 4, wherein the at least one coiled spring mechanism attach in rows to a first spring containment member side and a second spring containment member side of the channel.

7. The electromagnetic shielded door with constant force spring perimeter seal of claim 4, wherein the raised sealing surface comprises a flat surface.

8. The electromagnetic shielded door with constant force spring perimeter seal of claim 4, wherein the raised sealing surface comprises a grooved surface.

9. The electromagnetic shielded door with constant force spring perimeter seal of claim 4, wherein the raised sealing surface comprises a scalloped surface.

* * * * *